(12) United States Patent
Akerib

(10) Patent No.: US 10,891,991 B2
(45) Date of Patent: Jan. 12, 2021

(54) MASSIVELY PARALLEL, ASSOCIATIVE MULTIPLIER ACCUMULATOR

(71) Applicant: GSI Technology Inc., Sunnyvale, CA (US)

(72) Inventor: Avidan Akerib, Tel Aviv (IL)

(73) Assignee: GSI Technology Inc., Sunnyvale, CA (US)

( * ) Notice: Subject to any disclaimer, the term of this patent is extended or adjusted under 35 U.S.C. 154(b) by 29 days.

(21) Appl. No.: 16/199,258

(22) Filed: Nov. 26, 2018

(65) Prior Publication Data

US 2020/0168257 A1    May 28, 2020

(51) Int. Cl.
| | |
|---|---|
| *G11C 7/20* | (2006.01) |
| *G11C 7/12* | (2006.01) |
| *G06F 9/30* | (2018.01) |
| *G06F 7/544* | (2006.01) |

(52) U.S. Cl.
CPC .............. *G11C 7/12* (2013.01); *G06F 7/5443* (2013.01); *G06F 9/3001* (2013.01)

(58) Field of Classification Search
CPC ....................................................... G11C 7/20
USPC .......................................................... 365/154
See application file for complete search history.

(56) References Cited

U.S. PATENT DOCUMENTS

| | | | |
|---|---|---|---|
| 6,683,804 B1 * | 1/2004 | Eby ......................... | G11C 7/20 365/154 |
| 9,418,719 B2 | 8/2016 | Akerib et al. | |
| 2018/0157621 A1 | 6/2018 | Shu et al. | |

* cited by examiner

*Primary Examiner* — Jason Lappas
(74) *Attorney, Agent, or Firm* — Heidi Brun Associates Ltd.

(57) ABSTRACT

An in-memory multiplier-accumulator includes a memory array, a multi-bit multiplier and a multi-bit layered adder. The memory array has a multiplicity of rows and columns, each column being divided into a plurality of bit line processors and each bit line processor operating on its associated pair of input values. The multi-bit multiplier utilizes each bit line processor to multiply the associated pair of input values in each bit line processor to generate multiplication results. The multi-bit layered adder accumulates the multiplication results of each column of bit line processors.

15 Claims, 5 Drawing Sheets

MASSIVELY PARALLEL, ASSOCIATIVE MULTIPLIER ACCUMULATOR

FIELD OF THE INVENTION

The present invention relates to multiplier-accumulators generally.

BACKGROUND OF THE INVENTION

Multiplier-accumulators (MACs) are known in the art to handle the common operation of summing a large number of multiplications. Such an operation is part of dot product and matrix multiplications, which are common in image processing, as well as for convolutions, which are common in neural networks.

Mathematically, the operation is:

$$\Sigma_i A_i k_i \qquad \text{Equation 1}$$

where $A_i$ and $k_i$ are 8, 16 or 32 bit words. In software code, the MAC operation is a loop over i:

$$r_{i+1} = r_i + (A_i * k_i) \qquad \text{Equation 2}$$

where $r_i$ accumulates the changing values of $A_i k_i$.

Typically, a MAC will be formed as a separate unit providing its output to a central processing unit (CPU) or to a digital signal processor (DSP) and such units may receive output from several MACs.

Each MAC may comprise a multiplier, which may be implemented with combinational logic and may receive the values $A_i$ and $k_i$, an adder, receiving the output of the multiplier ($A_i k_i$) at one of its inputs, and an accumulator register that stores the output of the adder. The output of the accumulator register is fed back to the second input of the adder such that the adder continuously adds the current output of the multiplier to its previously added output (i.e. it implements equation 2). On each clock cycle, the output of the multiplier is added to the register.

SUMMARY OF THE PRESENT INVENTION

There is therefore provided, in accordance with a preferred embodiment of the present invention, an in-memory multiplier-accumulator including a non-destructive, non-volatile memory array and a controller. The non-destructive, non-volatile memory array has a multiplicity of rows and columns and each column is divided into a plurality of bit line processors. Each bit line processor operates on its associated pair of input values. The controller activates at least two rows of the memory array at a time to perform the following operations in parallel in each column: each the bit line processor multiplies its associated pair of input values to generate a multiplication result, and accumulating the multiplication results of each the column of bit line processors.

Moreover, in accordance with a preferred embodiment of the present invention, each bit line processor includes a data section storing the associated pair of input values, an intermediate results area and a results section storing its multiplication result.

Further, in accordance with a preferred embodiment of the present invention, the accumulating includes activating the rows of the results sections in a pyramid manner in order to add two multiplication results per column at a time.

Still further, in accordance with a preferred embodiment of the present invention, each column stores feature values from a different feature set to be processed and a selected set of rows store filter values of an associated filter such that each bit line processor holds one feature value and its associated filter value as the pair of input values.

Moreover, in accordance with a preferred embodiment of the present invention, the memory array stores at least two copies of the feature set in its columns.

Further, in accordance with a preferred embodiment of the present invention, for each copy of the feature set, different filter values are stored in its bit line processors, such that each copy of the feature set is filtered by a different filter.

Still further, in accordance with a preferred embodiment of the present invention, the memory array stores at least two feature sets in its columns.

Moreover, in accordance with a preferred embodiment of the present invention, each feature set is a different block of an image to be processed and wherein the filter values are values of at least one image processing filter.

There is also provided, in accordance with a preferred embodiment of the present invention, an in-memory multiplier-accumulator including a non-destructive, non-volatile memory array, a multi-bit multiplier and a multi-bit layered adder. The memory array has a multiplicity of rows and columns, each column being divided into a plurality of bit line processors and each bit line processor operating on its associated pair of input values. The multi-bit multiplier utilizes each the bit line processor to multiply the associated pair of input values in each the bit line processor to generate multiplication results. The multi-bit layered adder accumulates the multiplication results of each the column of bit line processors.

There is also provided, in accordance with a preferred embodiment of the present invention, a method for an in-memory multiplier-accumulator. The method includes dividing columns of a memory array having a multiplicity of rows and columns, into a plurality of bit line processors, each bit line processor operating on its associated pair of input values, and activating at least two rows of the memory array at a time to perform the following operations in parallel in each column—each the bit line processor multiplying its associated pair of input values to generate a multiplication result; and accumulating the multiplication results of each the column of bit line processors.

Moreover, in accordance with a preferred embodiment of the present invention, the accumulating includes activating rows of results sections of each bit line processor in a pyramid manner in order to add two multiplication results per column at a time.

Further, in accordance with a preferred embodiment of the present invention, the method includes storing feature values from a different feature set to be processed in each column and storing filter values of an associated filter in a selected set of rows such that each bit line processor holds one feature value and its associated filter value as the pair of input values.

Still further, in accordance with a preferred embodiment of the present invention, the method includes storing at least two copies of the feature set in columns of the memory array.

Moreover, in accordance with a preferred embodiment of the present invention, for each copy of the feature set, the method includes storing different associated filter values in its bit line processors, such that each copy of the feature set is filtered by a different associated filter.

Further, in accordance with a preferred embodiment of the present invention, the method includes storing at least two feature sets in columns of the memory array.

Still further, in accordance with a preferred embodiment of the present invention, each feature set is a different block of an image to be processed and wherein the filter values are values of at least one image processing filter.

Finally, there is provided, in accordance with a preferred embodiment of the present invention, a method for an in-memory multiplier-accumulator. The method includes dividing columns of a memory array having a multiplicity of rows and columns into a plurality of bit line processors, each bit line processor operating on its associated pair of input values, utilizing each the bit line processor to multiply the associated pair of input values in each the bit line processor to generate multiplication results, and accumulating the multiplication results of each the column of bit line processors.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 3 shows how the summing operation is performed in-memory and FIG. 4 shows a pyramid summing operation of the rows of FIG. 3;

FIG. 5 shows an image and an image filter with which to process the image, FIG. 6 illustrates the standard image processing operation with the image filter Q, and FIG. 7 illustrates its implementation in the multiply-accumulate unit of FIG. 1.

Figure 1:
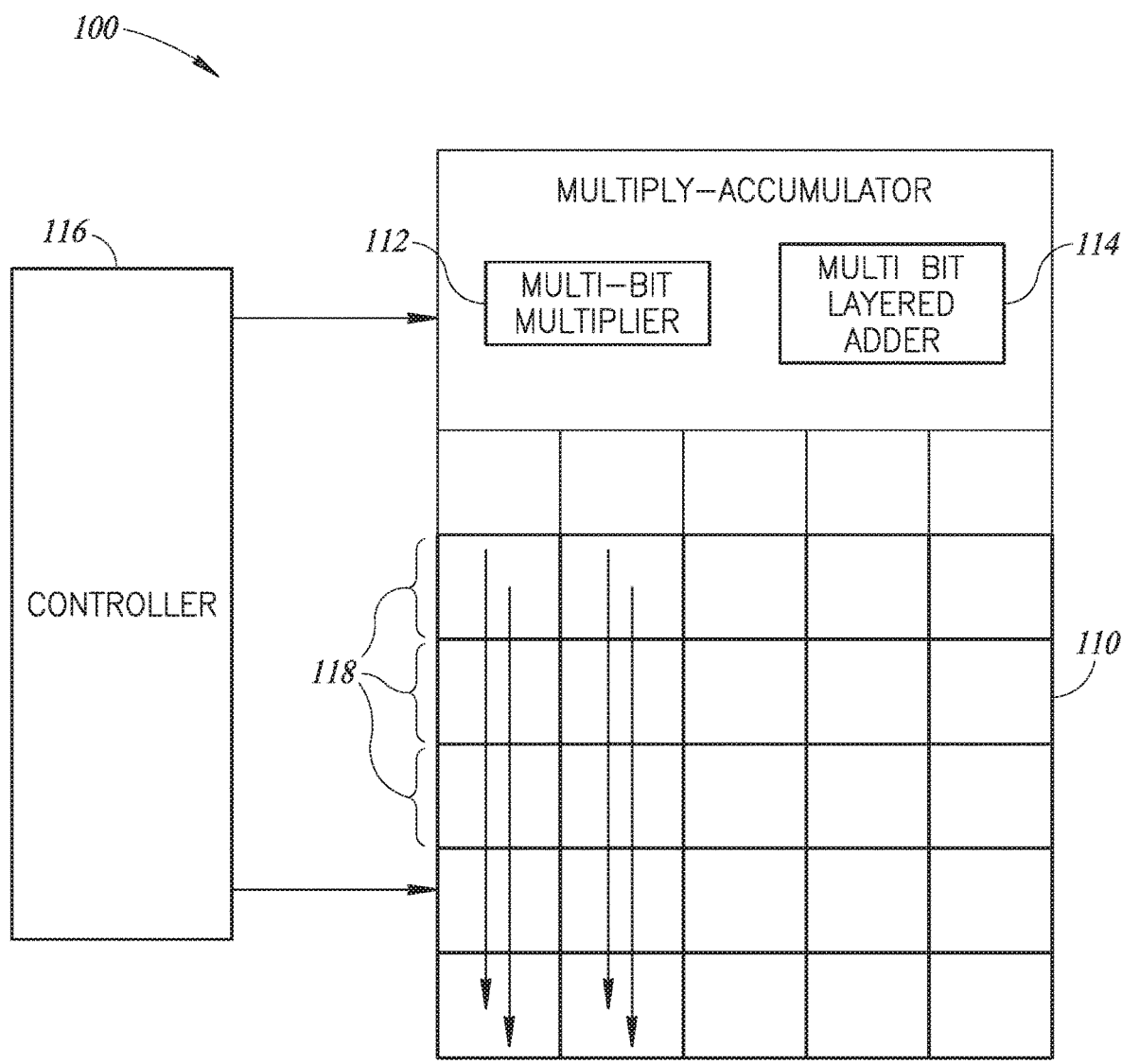
FIG. 1 is a schematic illustration of a massively parallel, associative, multiply-accumulate unit, constructed and operative in accordance with a preferred embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicant has realized that, because MAC units form specialized, extra units of a CPU (central processing unit) or DSP (digital signal processor), they require extra space on the CPU or DSP chip. This is a waste of space since the units are not always utilized. Moreover, if the CPU or DSP has to perform multiple MAC operations in parallel, the CPU or DSP needs to include multiple MAC units, which wastes more space.

Applicant has realized that space may be saved by implementing a MAC in an associative memory unit (i.e. a memory array which also performs operations on the data stored therein). Such an in-memory multiplier-accumulator unit may provide the CPU or DSP chip with memory for storage as well as providing massively parallel MAC operations, thereby increasing operational speed as well as decreasing chip real estate. With associative memory units, the limit to the number of parallel operations is the size of the memory. For example, a memory array with 32K columns may implement 32K MAC units.

Reference is now made to FIG. 1, which illustrates a massively parallel, associative MAC unit 100, constructed and operative in accordance with a preferred embodiment of the present invention. Massively parallel, associative MAC unit 100 may comprise a memory array 110, such as a non-destructive, non-volatile memory array, a multi-bit multiplier 112 and a multi-bit layered adder 114, where both multiplier 112 and adder 114 may operate on data in memory array 110. Memory array 110 may be controlled by a controller 116 which may access memory array 110 via a row decoder and a column decoder for reading to and writing from memory array 110.

In accordance with a preferred embodiment of the present invention, each column of MAC unit 100 may perform one multiply-accumulate operation. Thus, multiple MAC operations may be performed by operating on one or more rows at a time.

Each column of MAC unit 100 may comprise a plurality of bit line processors (BLP) 118, aligned along the columns of memory array 110. Each bit line processor may operate on its associated pair of input values $A_i$ and $k_i$, as described in more detail hereinbelow. Exemplary bit line processors are described in U.S. Pat. No. 9,418,719 entitled "In-Memory Computational Device", assigned to the common assignee of the present invention and incorporated herein by reference.

In accordance with a preferred embodiment of the present invention, controller 116 may activate the rows and columns of memory array 110 to implement multi-bit multiplier 112 such that each bit line processor 118 may perform the multiplication operation on its associated pair of input values $A_i$ and $k_i$ to produce a multiplication result $A_i k_i$. An exemplary associative multiplication operation is described in U.S. Ser. No. 15/915,113, now issued as U.S. Pat. No. 10,635,397 on Apr. 28, 2020, entitled "System and Method for Long Addition and Long Multiplication in Associative Memory", assigned to the common assignee of the present invention and incorporated herein by reference.

In accordance with a preferred embodiment of the present invention, controller 116 may activate the rows and columns of memory array 110 to implement multi-bit layered adder 114 to add together the multiplications from the multiple bit line processors 118. An exemplary 4 cycle full adder is described in U.S. Ser. No. 15/708,181, published as US 2018/0157621, assigned to the common assignee of the present invention and incorporated herein by reference.

Figure 2:
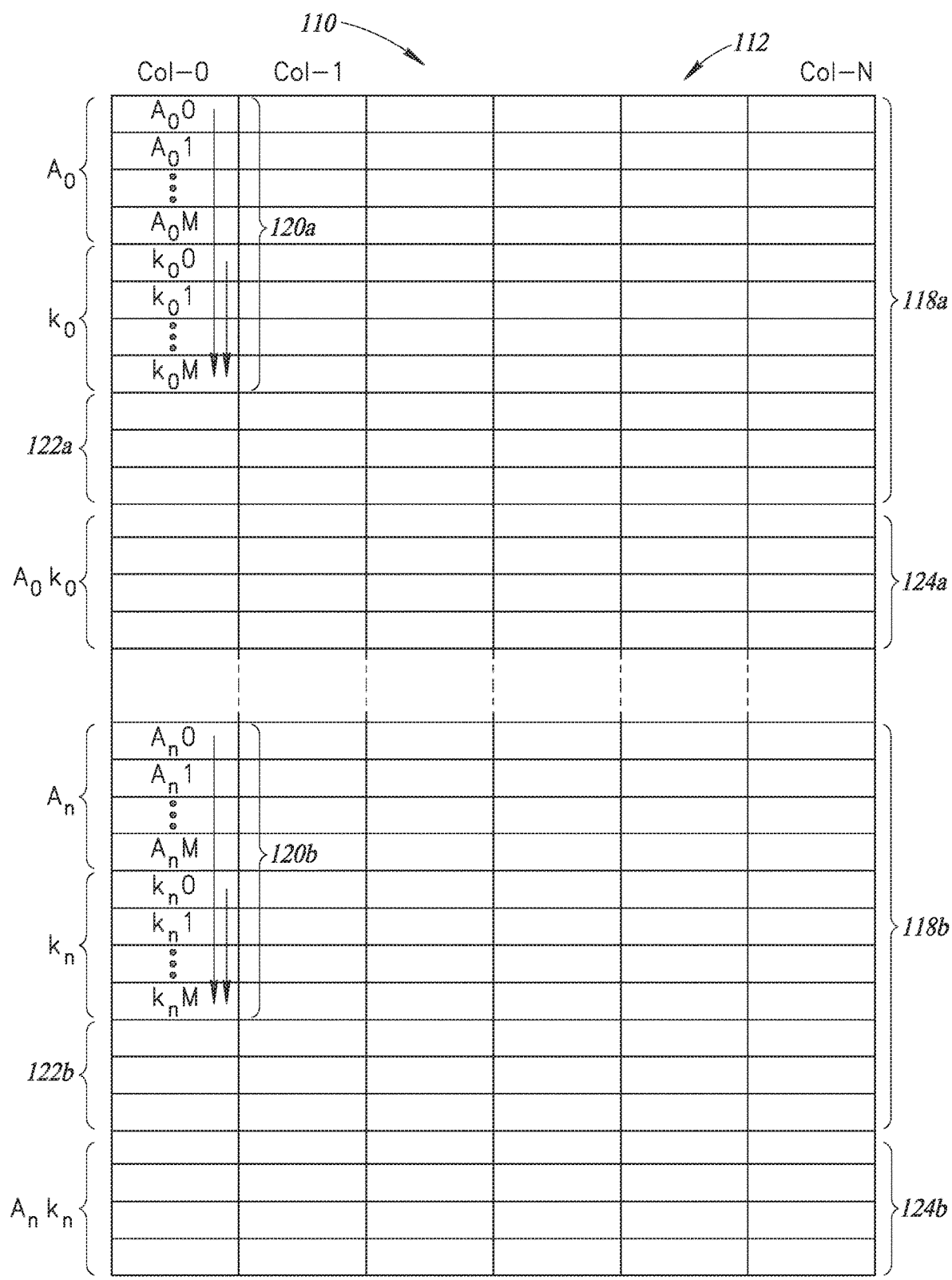
FIG. 2 is a schematic illustration of a multi-bit multiplier forming part of the multiply-accumulate unit of FIG. 1.

Reference is now made to FIG. 2, which illustrates multi-bit multiplier 112 and its operations. FIG. 2 illustrates a portion of memory array 110, where the columns are labeled Col-0, Col-1, etc., and the rows are labeled with the data stored therein. There may be N columns, one per MAC operation.

FIG. 2 shows 2 bit line processors, a first one, labeled 118a, for multiplying $A_0$ by $k_0$ and a second one, labeled 118b, for multiplying $A_n$ by $k_n$, where n may be the number of items to be accumulated by MAC unit 100. For example, n may be 15.

Each bit line processor 118 may store its input data to be multiplied in a data section 120, where FIG. 2 shows data sections 120a and 120b. For example, a first M rows may store the bits of $A_i$ and a second M rows may store the bits of $k_i$, where $A_i$ and $k_i$ may be 8 bit words (i.e. M=8), 16 bit words (i.e. M=16), etc.

Controller 116 may activate groups of rows in each bit line processor 118 to multiply $A_i$ by $k_i$, such as according to the associative multiplication operation described in U.S. Pat. No. 10,635,397. The multiplication operation may require a few rows, labeled 122, for storing intermediate results and for handling a rounding operation to round the result to M bits. This typically may take multiple cycles but occurs in every bit line processor 118 at the same time. Thus, at the end of the operation, all the multiplication results $A_i k_i$ of all columns have been generated. The multiplication result $A_i k_i$ may be stored in another m row, results section, here labeled 124.

Figure 3:
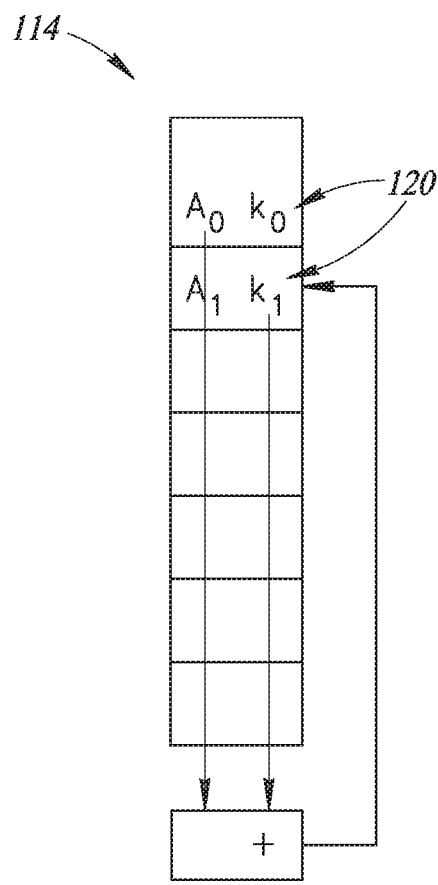
FIGS. 3 and 4 are schematic illustrations of the operation of a multi-bit layered adder forming part of the multiply-accumulate unit of FIG. 1, where
Figure 4:
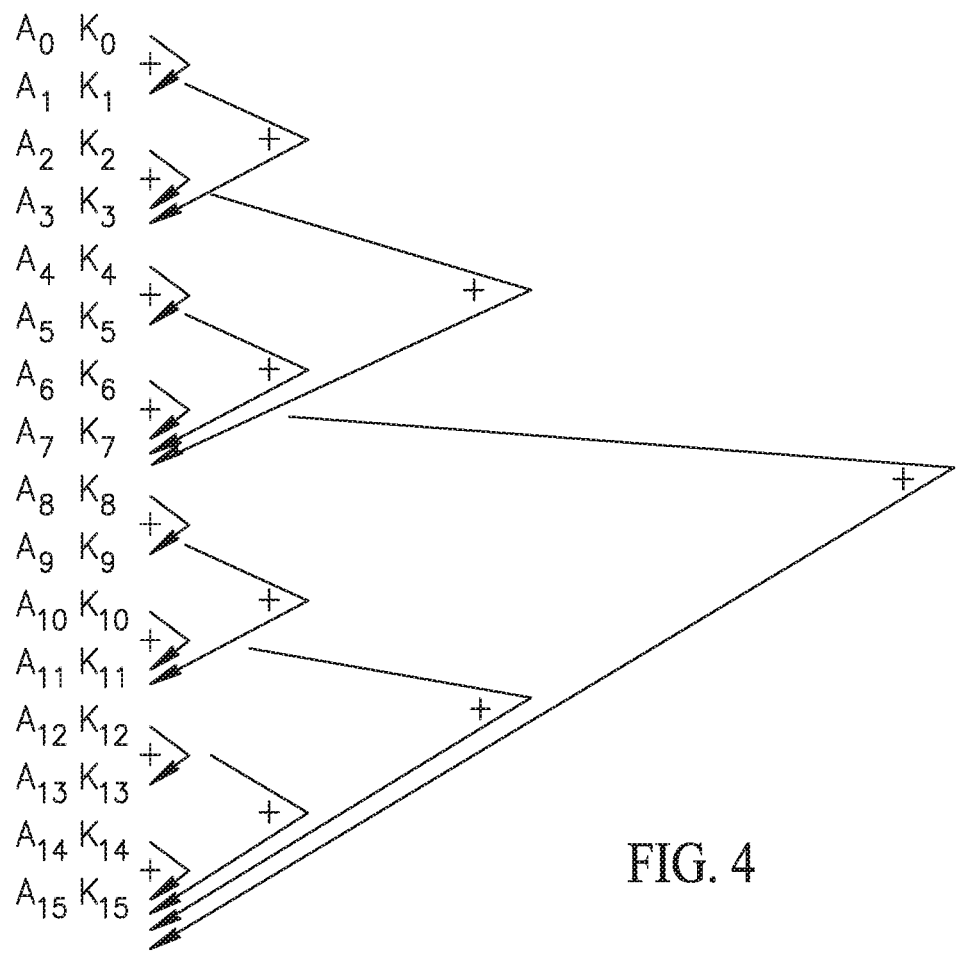

Reference is now made to FIGS. 3 and 4, which illustrate the operation of multi-bit layered adder 114. FIG. 3 shows results sections 120 for $A_0 k_0$ and $A_1 k_1$.

Controller 116 may activate groups of rows in each bit line processor 118 to implement multi-bit layered adder 114. Multi-bit layered adder 114 may add the $A_i k_i$ according to a pyramid operation such as shown in FIG. 4 and as described hereinbelow.

In a first step, multi-bit layered adder 114 may add neighboring even and odd $A_i k_i$ (i.e. may add $A_0 k_0 + A_i k_i$), such as according to US 2018/0157621, for all even i and may store the result in results section 120 of the odd, bit line processors 118 (i.e. in the bit line processors for i=1, 3, 5, 7, etc.).

In a second step, multi-bit layered adder 114 may add the $A_i k_i$ of every second row (i.e. of every odd row i=1, 3, etc.) and may store the results in the fourth row (i.e. i=3, 7, 11, etc.).

In a third step, multi-bit layered adder 114 may add the $A_i k_i$ of every fourth row (i.e. i=3, 7, 11, etc.), and may store the results in the eighth row (i.e. i=7, 15).

Finally, in a fourth step, multi-bit layered adder 114 may add the $A_i k_i$ of every eighth row (i.e. i=7, 15) and may store the results in the sixteenth row (i.e. i=15).

In other words, in each step, the most recently generated sum may be added to its most recently generated, neighboring sum in a pyramid fashion until all the data has been added together. This occurs over all columns at once. The result may then be provided as the result of the multiply-accumulate operation of MAC unit 100 for each column.

It will be appreciated that the data for each multiply-accumulate operation are stored and operated upon in a single column. However, each of the multiplications and additions are performed on an entire row of the array. Thus, each of the multiplications and additions are performed in parallel. The result is a massively parallel, multiply-accumulate operation.

It will be appreciated that MAC unit 100 may speed up all operations that require significant MAC operations, such as convolutions, image processing operations, digital signal processing operations, etc.

It will be appreciated that the data to be multiplied and accumulated has to be stored in columns rather than in rows, as in the prior art.

Figure 5:
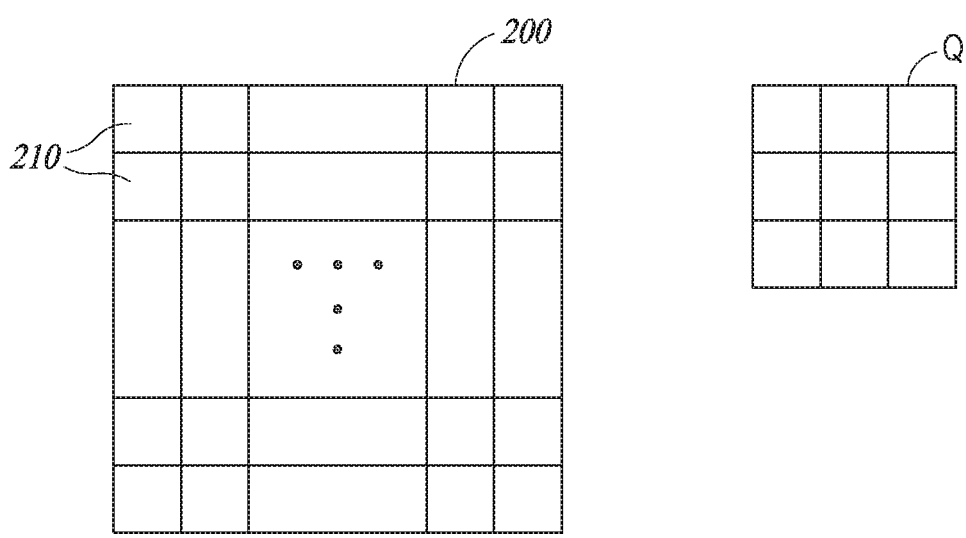
FIGS. 5, 6 and 7 are schematic illustrations of an image processing operation utilizing the multiply-accumulate unit of FIG. 1, where
Figure 6:
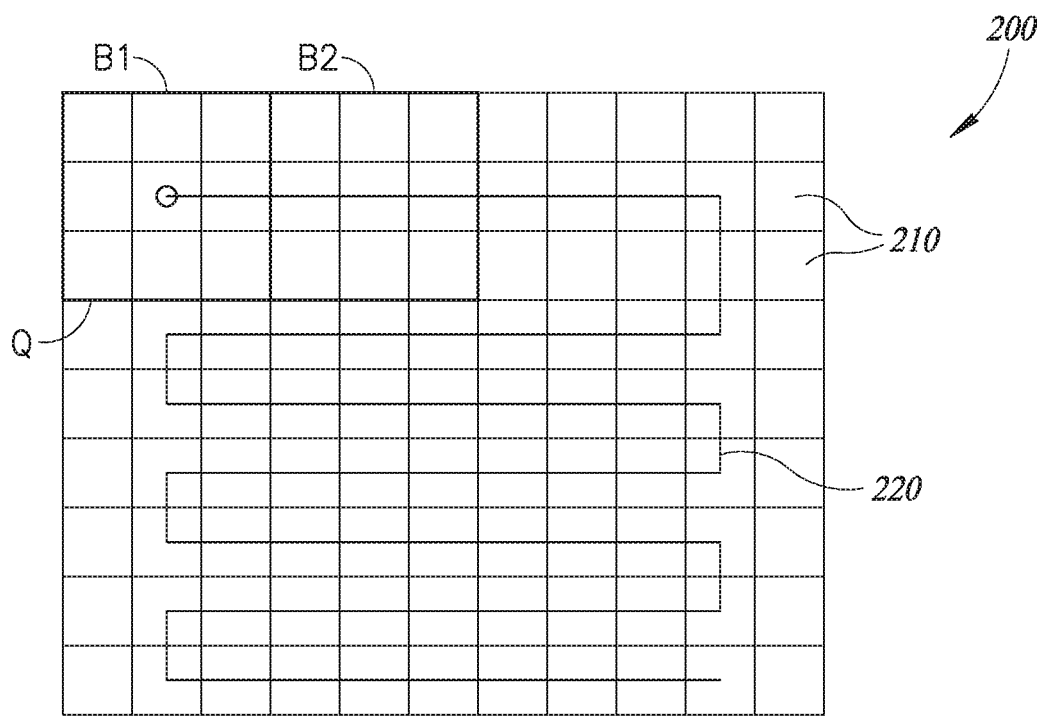
Figure 7:
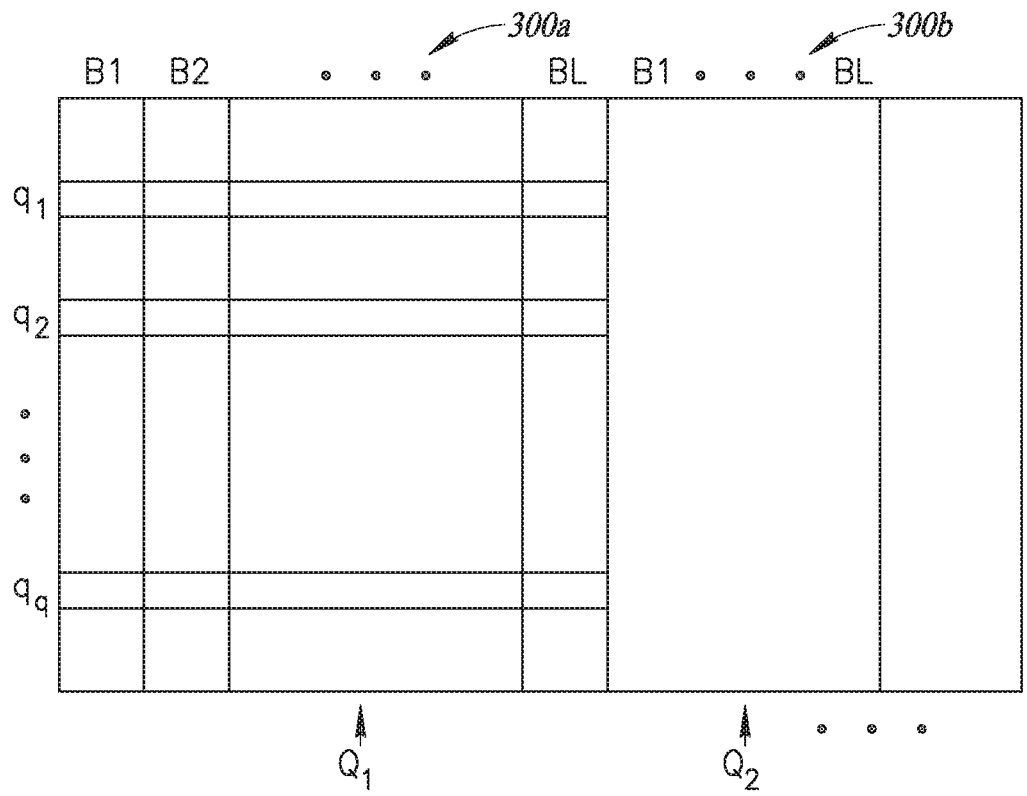

Reference is now made to FIGS. 5, 6 and 7, which illustrate an image processing operation which may utilize MAC unit 100. FIG. 5 shows an image 200 having rows and columns of pixels 210 and an image filter Q with which to process image 200. FIG. 6 illustrates the standard image processing operation with image filter Q and FIG. 7 illustrates its implementation in MAC unit 100.

Image filter Q may be a 3×3 matrix and may be convolved with each 3×3 block Bp of pixels of image 200 (FIG. 6). In the convolution process, image filter Q is shifted along image 200, as indicated by the snaking arrow 220 of FIG. 6. The convolution process creates a smaller resultant image where each pixel is the matrix multiplication of BpQ. However, the convolution process is time-consuming as the matrix multiplication operation has to happen for each block Bp.

The convolution process may be implemented computationally more efficiently using MAC unit 100, as shown in FIG. 7. In this example, each column processes one block Bp, where there may be L blocks Bp and thus, L columns. In accordance with a preferred embodiment of the present invention, each of the 9 pixels of image filter Q may be provided to each column, such that each of the 9 pixels of each Bp may be multiplied by the associated one of the 9 pixels of image filter Q. FIG. 7 shows each column with a different block Bp and separate rows for each element $q_i$ of image filter Q, repeated at each column.

Thus, each bit line processor 118 may store the data of one pixel from its block Bp, one pixel from image filter Q and their resultant multiplication, and the final bit line processor 118 of each column may produce the result of the multiply-accumulate operation on its column.

Applicant has realized that, with enough columns, MAC unit 100 may convolve image 200 with multiple filters $Q_r$. To do this, MAC unit 100 may divide the columns into sections 300 of L columns, each of which may store the blocks of image 200 in the columns. To apply the separate filters $Q_r$, MAC unit 100 may store different filter data per section 300. Thus, section 300a may store the elements $q_i$ from filter $Q_1$ while section 300b may store the elements $q_i$ from filter $Q_2$.

It will be appreciated that, with enough columns, MAC unit 100 may perform all the different types of convolutions needed to process an image, in a single, massively parallel operation. If the image is small enough or if there are enough columns, MAC unit 100 may perform the image processing on multiple images at a time. This may provide a very significant increase in speed for image processing operations.

It will be appreciated that MAC unit 100 may be utilized for massively parallel, matrix multiplication operations of all kinds, as well as for dot product calculations, which are common in similarity search operations.

For example, instead of operating on images, MAC unit 100 may operate on any large collection of features. In this embodiment, each column stores values from a feature set to be processed and each filter row (the rows where the $q_r$s are shown in FIG. 7) store filter values of an associated filter such that each bit line processor holds one pixel value and its associated filter value as the pair of input values.

Unless specifically stated otherwise, as apparent from the preceding discussions, it is appreciated that, throughout the specification, discussions utilizing terms such as "processing," "computing," "calculating," "determining," or the like, refer to the action and/or processes of a general purpose computer of any type such as a client/server system, mobile computing devices, smart appliances or similar electronic computing device that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention may include apparatus for performing the operations herein. This apparatus may be specially constructed for the desired purposes, or it may comprise a general-purpose computer or a client/server configuration selectively activated or reconfigured by a computer program stored in the computer. The resultant apparatus when instructed by software may turn the general purpose computer into inventive elements as discussed herein. The instructions may define the inventive device in operation with the computer platform for which it is desired. Such a computer program may be stored in a computer readable storage medium, such as, but not limited to, any type of disk, including optical disks, magnetic-optical disks, read-only memories (ROMs), volatile and non-volatile memories, random access memories (RAMs), electrically programmable read-only memories (EPROMs), electrically erasable and programmable read only memories (EEPROMs), magnetic or optical cards, Flash memory, disk-on-key or any other type of media suitable for storing electronic instructions and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. An in-memory multiplier-accumulator comprising:
a non-destructive, non-volatile memory array having a multiplicity of rows and columns, each column being divided into a plurality of bit line processors, each bit line processor operating on its associated pair of input values; and
a controller to activate at least two rows of said memory array at a time to perform the following operations in parallel in each column:
each said bit line processor multiplying its said associated pair of input values to generate a multiplication result; and
accumulating the multiplication results of each said column of bit line processors.

2. The multiplier-accumulator according to claim 1 and wherein each said bit line processor comprises a data section storing said associated pair of input values, an intermediate results area and a results section storing its said multiplication result.

3. The multiplier-accumulator according to claim 2 and wherein said accumulating comprises activating the rows of said results sections in a pyramid manner in order to add two multiplication results per column at a time.

4. The multiplier-accumulator according to claim 1 wherein each column stores feature values from a different feature set to be processed and wherein a selected set of rows store filter values of an associated filter such that each bit line processor holds one feature value and its associated filter value as said pair of input values.

5. The multiplier-accumulator according to claim 4 wherein said memory array stores at least two copies of said feature set in its columns.

6. The multiplier-accumulator according to claim 5 wherein for each copy of said feature set, different filter values are stored in its bit line processors, such that each copy of said feature set is filtered by a different filter.

7. The multiplier-accumulator according to claim 4 wherein said memory array stores at least two feature sets in its columns.

8. The multiplier-accumulator according to claim 4 wherein each feature set is a different block of an image to be processed and wherein said filter values are values of at least one image processing filter.

9. A method for an in-memory multiplier-accumulator, the method comprising:
dividing columns of a memory array having a multiplicity of rows and columns, into a plurality of bit line processors, each bit line processor operating on its associated pair of input values; and
activating at least two rows of said memory array at a time to perform the following operations in parallel in each column:
each said bit line processor multiplying its said associated pair of input values to generate a multiplication result; and
accumulating the multiplication results of each said column of bit line processors.

10. The method according to claim 9 and wherein said accumulating comprises activating rows of results sections of each bit line processor in a pyramid manner in order to add two multiplication results per column at a time.

11. The method according to claim 9 and comprising storing feature values from a different feature set to be processed in each column and storing filter values of an associated filter in a selected set of rows such that each bit line processor holds one feature value and its associated filter value as said pair of input values.

12. The method according to claim 11 and comprising storing at least two copies of said feature set in columns of said memory array.

13. The method according to claim 12 wherein for each copy of said feature set, storing different associated filter values in its bit line processors, such that each copy of said feature set is filtered by a different associated filter.

14. The method according to claim 12 and comprising storing at least two feature sets in columns of said memory array.

15. The method according to claim 11 wherein each feature set is a different block of an image to be processed and wherein said filter values are values of at least one image processing filter.

* * * * *